United States Patent
Yang et al.

(10) Patent No.: US 10,878,923 B1
(45) Date of Patent: Dec. 29, 2020

(54) PARTIAL PAGE SENSING MODE, METHOD, AND APPARATUS FOR 3D NAND

(71) Applicant: SanDisk Technologies LLC, Addison, TX (US)

(72) Inventors: Xiang Yang, San Jose, CA (US); Yu-Chung Lien, San Jose, CA (US)

(73) Assignee: SanDisk Technologies LLC, Addison, TX (US)

(*) Notice: Subject to any disclaimer, the term of this patent is extended or adjusted under 35 U.S.C. 154(b) by 0 days.

(21) Appl. No.: 16/453,202

(22) Filed: Jun. 26, 2019

(51) Int. Cl.
| | |
|---|---|
| *G11C 16/26* | (2006.01) |
| *G11C 16/24* | (2006.01) |
| *H01L 27/1157* | (2017.01) |
| *G11C 16/04* | (2006.01) |
| *H01L 27/11565* | (2017.01) |
| *H01L 27/11582* | (2017.01) |

(52) U.S. Cl.
CPC .......... *G11C 16/26* (2013.01); *G11C 16/0483* (2013.01); *G11C 16/24* (2013.01); *H01L 27/1157* (2013.01); *H01L 27/11565* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 9,269,447 B1* | 2/2016 | Nakajima | G11C 11/5628 |
| 2009/0091981 A1* | 4/2009 | Park | G11C 16/3418 |
| | | | 365/185.12 |
| 2009/0175087 A1* | 7/2009 | Park | G11C 16/3454 |
| | | | 365/185.22 |
| 2012/0327711 A1* | 12/2012 | Shim | G11C 11/5642 |
| | | | 365/185.03 |
| 2014/0269053 A1* | 9/2014 | Chen | G11C 7/24 |
| | | | 365/185.03 |
| 2015/0357045 A1* | 12/2015 | Moschiano | G06F 11/1048 |
| | | | 714/720 |

* cited by examiner

*Primary Examiner* — Tan T. Nguyen
(74) *Attorney, Agent, or Firm* — Dickinson Wright PLLC; Steven Hurles

(57) ABSTRACT

A partial page sensing method and system are provided in which, while a bit line voltage (VBLC) is applied to first bit lines of a first partial page of a memory cell array, second bit lines, of a second partial page are floated. The second bit lines of the second partial page are bit lines which are interleaved with the first bit lines of the first partial page. Bit lines associated with one or more additional partial pages may be grounded or floated. A bit line associated with an additional partial page which is adjacent to one of the first bit lines may be floated.

12 Claims, 15 Drawing Sheets

PARTIAL PAGE SENSING MODE, METHOD, AND APPARATUS FOR 3D NAND

BACKGROUND

1. Field

Systems, apparatuses, and methods consistent with exemplary embodiments relate to scanning of three dimensional (3D) NAND flash memories, and more specifically to partial page sensing (PPS) including biasing of bit lines (BL) of unselected partial pages for 3D NAND flash memory devices.

2. Description of the Related Art

3D NAND flash memory is a type of non-volatile flash memory in which memory cells are stacked vertically in multiple layers. 3D NAND was developed to address challenges encountered in scaling two dimensional (2D) NAND technology to achieve higher densities at a lower cost per bit.

A memory cell is an electronic device or component capable of storing electronic information. Non-volatile memory may utilize floating-gate transistors, charge trap transistors, or other transistors as memory cells. The ability to adjust the threshold voltage of a floating-gate transistor or charge trap transistor allows the transistor to act as a non-volatile storage element (i.e. a memory cell), such as a single-level cell (SLC) which stores a single bit of data. In some cases more than one data bit per memory cell can be provided (e.g., in a multi-level cell) by programming and reading multiple threshold voltages or threshold voltage ranges. Such cells include, but are not limited to a multi-level cell (MLC), storing two bits per cell; a triple-level cell (TLC), storing three bits per cell; and a quad-level cell (QLC), storing four bits per cell.

FIG. 1 illustrates a diagram of an exemplary 3D NAND memory 100. The memory 100 includes multiple physical layers that are monolithically formed above a substrate 34, such as a silicon substrate.

Storage elements, for example memory cells 301, are arranged in arrays in the physical layers. A memory cell 301 includes a charge trap structure 44 between a word line 300 and a conductive channel 42. Charge can be injected into or drained from the charge trap structure 44 via biasing of the conductive channel 42 relative to the word line 300. For example, the charge trap structure 44 can include silicon nitride and can be separated from the word line 300 and the conductive channel 42 by a gate dielectric, such as a silicon oxide. An amount of charge in the charge trap structure 44 affects an amount of current through the conductive channel 42 during a read operation of the memory cell 301 and indicates one or more bit values that are stored in the memory cell 301.

The 3D memory 100 includes multiple erase blocks 80. Each block 80 includes a "vertical slice" of the physical layers that includes a stack of word lines 300. Multiple conductive channels 42 (having a substantially vertical orientation, as shown in FIG. 1) extend through the stack of word lines 300. Each conductive channel 42 is coupled to a storage element in each word line 300, forming a NAND string of storage elements, extending along the conductive channel 42. FIG. 1 illustrates three blocks 80, five word lines 300 in each block 80, and three conductive channels 42 in each block 80 for clarity of illustration. However, the 3D memory 100 can have more than three blocks, more than five word lines per block, and more than three conductive channels per block.

A read/write circuitry 68 is coupled to the conductive channels 420 via multiple conductive lines: bit lines, illustrated as a first bit line BL0, a second bit line BL1, and a third bit line BL2 at a first end of the conductive channels (e.g., an end most remote from the substrate 34) and source lines, illustrated as a first source line SL0, a second source line SL1, and a third source line SL2, at a second end of the conductive channels (e.g., an end nearer to or within the substrate 234). The read/write circuitry 68 is illustrated as coupled to the bit lines BL0-BL2 via "P" control lines, coupled to the source lines SL0-SL2 via "M" control lines, and coupled to the word lines 300 via "N" control lines. Each of P, M, and N can have a positive integer value based on the specific configuration of the 3D memory 100.

Each of the conductive channels 42 is coupled, at a first end to a bit line BL, and at a second end to a source line SL. Accordingly, a group of conductive channels 42 can be coupled in series to a particular bit line BL and to different source lines SL.

It is noted that although each conductive channel 42 is illustrated as a single conductive channel, each of the conductive channels 42 can include multiple conductive channels that are in a stack configuration. The multiple conductive channels in a stacked configuration can be coupled by one or more connectors. Furthermore, additional layers and/or transistors (not illustrated) may be included as would be understood by one of skill in the art.

The read/write circuitry 68 facilitates and/or effectuates read and write operations performed on the 3D memory 100. For example, data can be stored to storage elements coupled to a word line 300 and the read/write circuitry 68 can read bit values from the memory cells 301 using one or more sense blocks 36.

The read/write circuitry 68 includes one or more sense blocks 36. The sense blocks 36 are utilized to read or sense one or more values stored in a memory cell 301. In one approach, one sense block 36 is provided for a group of NAND strings, each of which is coupled to a particular bit line BL. Each sense block 36 can include a memory controller (not illustrated in FIG. 1). Each sense block 36 also includes a sense module for each NAND string. Alternatively, a sense block 36 can be coupled to an interval of bit lines, such as even or odd numbered bit lines.

During a read operation, a controller can receive a request from a host device, such as a computer, smartphone, or laptop computer. The controller can cause the read/write circuitry 68 to read bits from particular storage elements of the 3D memory 100 by applying appropriate signals to the control lines to cause storage elements of a selected word line to be sensed. Accordingly, the 3D memory 100 having multiple conductive channels in a stacked configuration can be configured to read from and write data to one or more storage elements.

FIGS. 2A and 2B illustrate exemplary adjacent bit lines during a sensing operation, the driving signals applied to the bit lines, and the resultant array signals. FIG. 2A illustrates three exemplary adjacent bit lines during a sensing operation in which driving signals, as shown, are applied to each of the three bit lines. For example, the driving signal may ramp from 0V to 0.5V. As would be understood to one of skill in the art, when a signal is applied to a driver line, e.g. the bit lines in FIG. 2A, the resultant array signal will experience some delay, resulting in the "rounding" of the array signals as shown in FIG. 2A. In the case of FIG. 2A, identical driving signals are applied to all of the bit lines, and therefore there is no interaction among the bit lines, and no capacitance is generated between adjacent bit lines. As a result, the corresponding array signals are quick to ramp-up to the final 0.5V, as shown in the steep rising edges of FIG. 2A.

FIG. 2B illustrates three exemplary adjacent bit lines during a sensing operation in which only the center bit line is driven, from 0V to 0.5V, for example, and the other bit lines are kept at 0V. In this case, there is a difference between the voltage of the driven bit line and the adjacent bit lines, causing capacitance coupling between the center bit line and the adjacent bit lines, as shown. Thus, the capacitance slows down the ramp rate of the array signal corresponding to the center bit line. At the same time, due to the capacitance coupling, the array signals corresponding to the non-driven bit lines ramp up a small amount before ramping back down to 0V.

Thus, importantly, when a driven bit line is adjacent to bit lines which are maintained at 0V, the corresponding array signal is slow to ramp up.

During programming of a 3D NAND word line, a program loop includes three phases: a precharge phase, a program phase, and a verify phase. During the precharge phase, a very low precharge voltage is applied to all of the cells being programmed. During the program phase, the program voltage (VPGM) is applied to the specific word line and a pass voltage (VUSEL) is applied to the other word liens. VPGM may be, for example, 20V. During the verify phase, a verify voltage (VCGRV) is applied to the specific word lines and a bit line voltage (VBLC) is applied to bit lines and then sensing is performed. VBLC may be, for example, 0.3V. The timing of the sensing operation is important. If sensing is performed too soon after the VBLC is applied, there hasn't been sufficient time for a complete ramp-up, and the sensing is inaccurate. Alternately, if there is too long of a delay in sensing, the program time increases and degrades the program performance.

In some instances, rather than an entire string, i.e. a "page" being programmed, for high performance applications, partial page programming (PPP) and partial page sensing (PPS) may be used in which a page is divided into two or more "partial pages" and only a single one of the partial pages is programmed at a time. Due to the unique 3D NAND multi-string architecture, PPP and PPS are only used in conjunction with single-level cells (SLC). PPS is intended to provide faster sensing (for read and verify operations) and lower Intraclass Correlation Coefficient (Icc).

FIG. 3 illustrates a cross-sectional view of a layer of cells in a 3D NAND memory and shows four strings of cells (strings 0, 1, 2, and 3). The vertical lines represent the bit lines that connect to the illustrated cells. FIG. 3 illustrates a string 0 divided into two partial pages. In this case, the block is divided into two partial pages, each including 50% of the memory cells in the block. Sensing with a block divided into two partial pages is referred to as ½ partial page sensing (2PPS). When a block is divided into four partial pages, each including 25% of the cells, sensing is referred to as ¼ partial page sensing (4PPP).

FIGS. 4A, 4B, and 4C illustrate diagrams of full page sensing, ½ partial page sensing (2PPP), and ¼ partial page sensing (4PPP), and the corresponding bit lines.

FIG. 4A provides a diagram of full page sensing performed on string 0. During the verify phase of a programming loop in which full page sensing is performed, the verify voltage VBLC, e.g. 0.3V, is applied to all of the bit lines, illustrated as bold solid lines in FIG. 4A. Thus, the same voltage, VBLC, is applied to all the adjacent bit lines.

FIG. 4B provides a diagram of ½ partial page sensing (2PPS) performed on one partial page of string 0. According to this example, a partial page includes the first two rows or last two rows of memory holes. Thus, the VBLC is applied only to the first two or last two rows of memory holes, and the other partial page is grounded. Due to bit line interleaving, this corresponds to "alternate BL charging" meaning that VBLC is applied to every other bit line (i.e. alternating bit lines), shown as bold, solid lines in FIG. 4B. In this case, PP #1 is selected, and the bit lines corresponding to PP #1, shown in bold, black lines, are driven to VBLC. Adjacent bit lines corresponding to non-selected PP #0, shown in dashed lines, are grounded. It should be noted that although certain bit lines are represented with dashed lines, in order to distinguish from those bit lines represented with solid lines, all bit lines are continuous conductors without breaks therein. Accordingly, each bit line that is charged to VBLC, e.g. 0.3V, is adjacent to two bit lines that remain at 0V.

FIG. 4C provides a diagram of ¼ partial page sensing (4PPS) performed on one partial page of string 0. According to this example, a partial page includes half of either the first two rows of the last two rows of memory holes. Please note that, while only one region of each of PP #0, PP #1, PP #2, and PP #3 is shown, this is merely the smallest repeatable physical unit. In other words, the region shown, including PP #0, PP #1, PP #2, and PP #3 may be repeated. Thus, the VBLC is applied to only one partial page and the others are grounded. In this case, PP #2 is selected, and the bit lines, corresponding to PP #2, shown as bold, solid lines, are driven to VBLC. Bit lines corresponding to the non-selected PP #0, PP #1, and PP #3, shown in dashed lines, are grounded. This corresponds to alternate BL charging for the bit lines of PP #2 and PP #0.

FIGS. 5A and 5B illustrate different sensing times for full page sensing (FIG. 5A) as compared to 2PPS in which the page is divided into two partial pages. As noted, PPS is intended to provide faster sensing, as only a portion of the string is being sensed. However, as shown in FIGS. 5A and 5B, it has been discovered by the inventors that PPS shows significant failure during programming. Specifically, PPS unexpectedly requires much longer verify times than full page sensing, and also the Icc is unexpectedly high. Thus, this is a clear problem rendering related-art PPP and PPS operations effectively useless.

As noted above, with related art 2PPS, the alternate bit line charging results in strong bit line-bit line capacitive coupling between adjacent bit lines resulting in the slow sensing/reading time described above with reference to FIG. 2B. Likewise, with related art 4PPS, when one partial page is sensed, the bit lines charged to VBLC, are interleaved with bit lines for another partial page, and the bit line-bit line capacitive coupling between bit lines significantly slows down the sensing/reading time.

SUMMARY

Exemplary embodiments may address at least the above problems and/or disadvantages and other disadvantages not described above. Also, exemplary embodiments are not required to overcome the disadvantages described above, and may not overcome any of the problems described above.

According to an aspect of an exemplary embodiment, a partial page sensing method may comprise applying a bit line voltage to first bit lines of a memory cell array, wherein the memory cell array comprises a plurality of strings of memory cells, each string of memory cells partitioned into a plurality of partial pages comprising a first partial page connected to the first bit lines, and a second partial page connected to second bit lines which are interleaved with the first bit lines. The method further comprises, while applying the bit line voltage to the first bit lines, floating the second bit lines, and additionally, one of reading and sensing memory cells within the first partial page.

In addition to the first partial page connected to the first bit lines, and the second partial page connected to the second bit lines, which are interleaved with the first bit lines, the partial pages may also include a third partial page connected to third bit lines, and a fourth partial page connected to fourth bit lines which are interleaved with the third bit lines. The method may further comprise, while applying the bit line voltage to the first bit lines and floating the second bit lines, grounding the third bit lines and the fourth bit lines.

The method may further comprise, while applying the bit line voltage to the first bit lines and floating the second bit lines, floating the third bit lines and the fourth bit lines.

The method may further comprise, while applying the bit line voltage to the first bit lines: grounding the third bit lines, floating a boundary fourth bit line which is one of the fourth bit lines which is adjacent to one of the first bit lines, and grounding the fourth bit lines that are not adjacent to any one of the first bit lines.

The method may further comprise while applying the bit line voltage to the first bit lines: grounding the third bit lines, applying the verify voltage to a boundary fourth bit line which is one of the fourth bit lines which is adjacent to one of the first bit lines, and grounding the fourth bit lines that are not adjacent to any one of the first bit lines.

According to an aspect of another exemplary embodiment, a non-volatile memory storage system comprises: a memory cell array coupled to a word line, the memory cell array comprising a plurality of strings of memory cells, each string of memory cells partitioned into a plurality of partial pages comprising a first partial page connected to the first bit lines, and a second partial page connected to second bit lines which are interleaved with the first bit lines; and a partial page circuit comprising an operation circuit and a sense circuit. The operation circuit is configured to apply a bit line voltage to the first bit lines and, while applying the bit line voltage to the first bit lines, floating the second bit lines. The sense circuit is configured to perform one of reading and sensing memory cells within the first partial page.

The operation circuit may be further configured to ground the third bit lines and the fourth bit lines, while applying the bit line voltage to the first bit lines.

The operation circuit may be further configured to float the third bit lines and the fourth bit lines, while applying the bit line voltage to the first bit lines.

The operation circuit may be further configured to ground the third bit lines, to float a boundary fourth bit line which is one of the fourth bit lines adjacent to one of the first bit lines, and to ground the fourth bit lines that are not adjacent to any one of the first bit lines, while applying the bit line voltage to the first bit lines.

According to an aspect of another exemplary embodiment A non-volatile computer-readable medium may be provided, having recorded thereon a program which, when executed by a processor, causes the processor to execute a method according to one or more of the aspects discussed above.

BRIEF DESCRIPTION OF THE DRAWINGS

The above and/or other aspects will become apparent and more readily appreciated from the following description of exemplary embodiments, taken in conjunction with the accompanying drawings in which.

DETAILED DESCRIPTION

Figure 1:
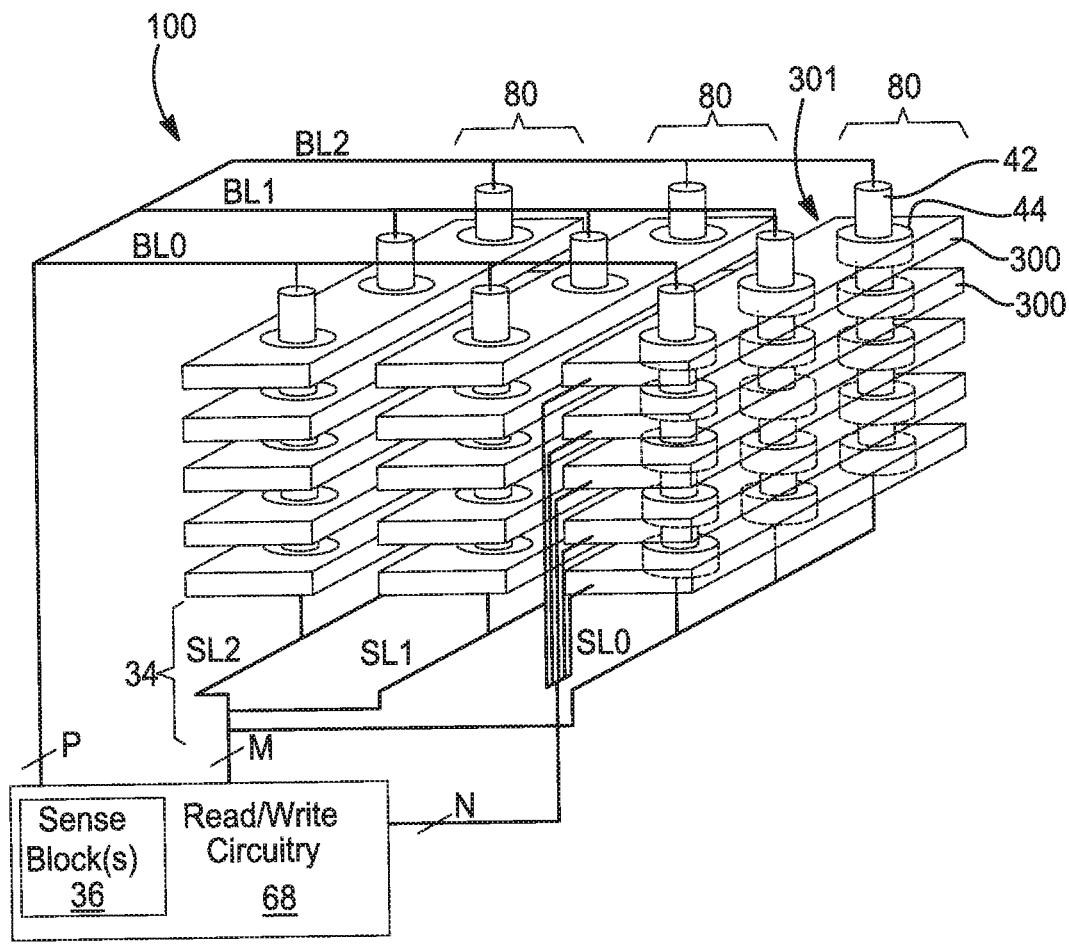
FIG. 1 illustrates a diagram of an exemplary 3D NAND memory 100.
Figure 2A:
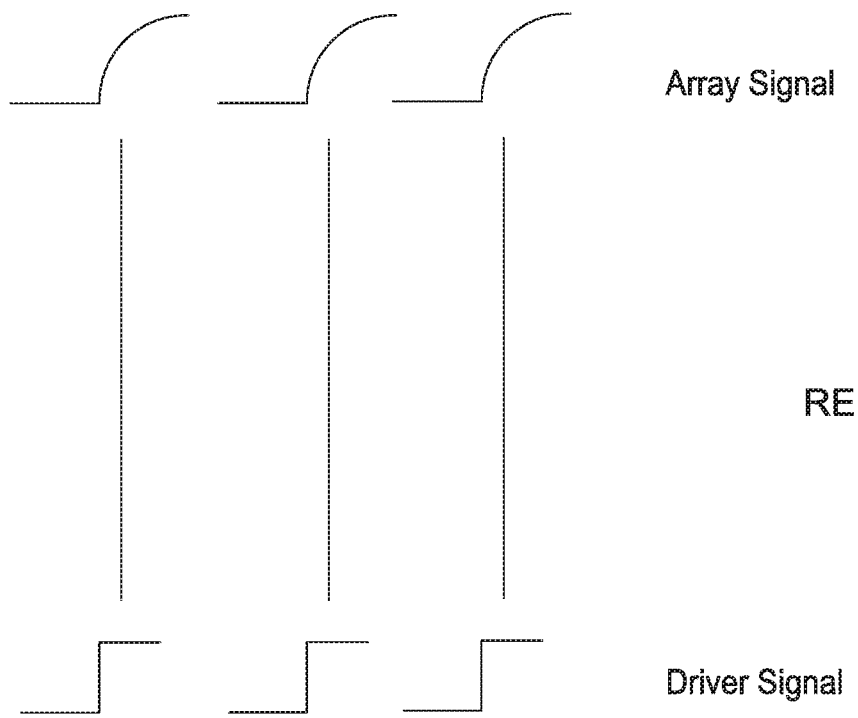
FIGS. 2A and 2B illustrate exemplary adjacent bit lines during a sensing operation, the driving signals applied to the bit lines, and the resultant array signals.
Figure 2B:
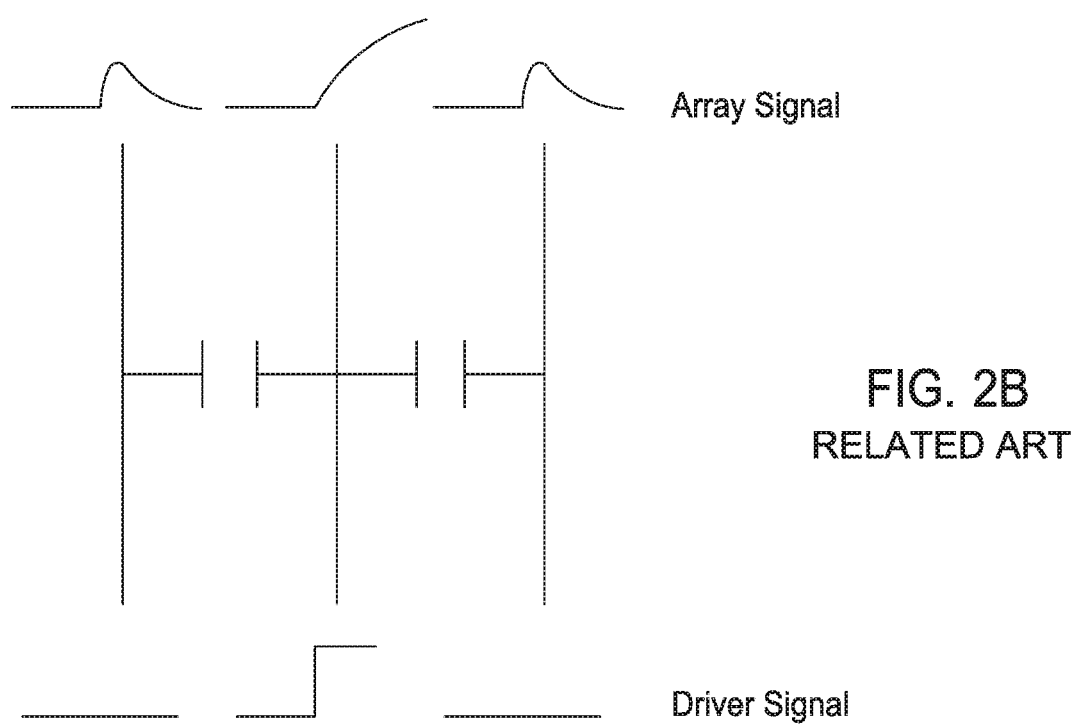
Figure 3:
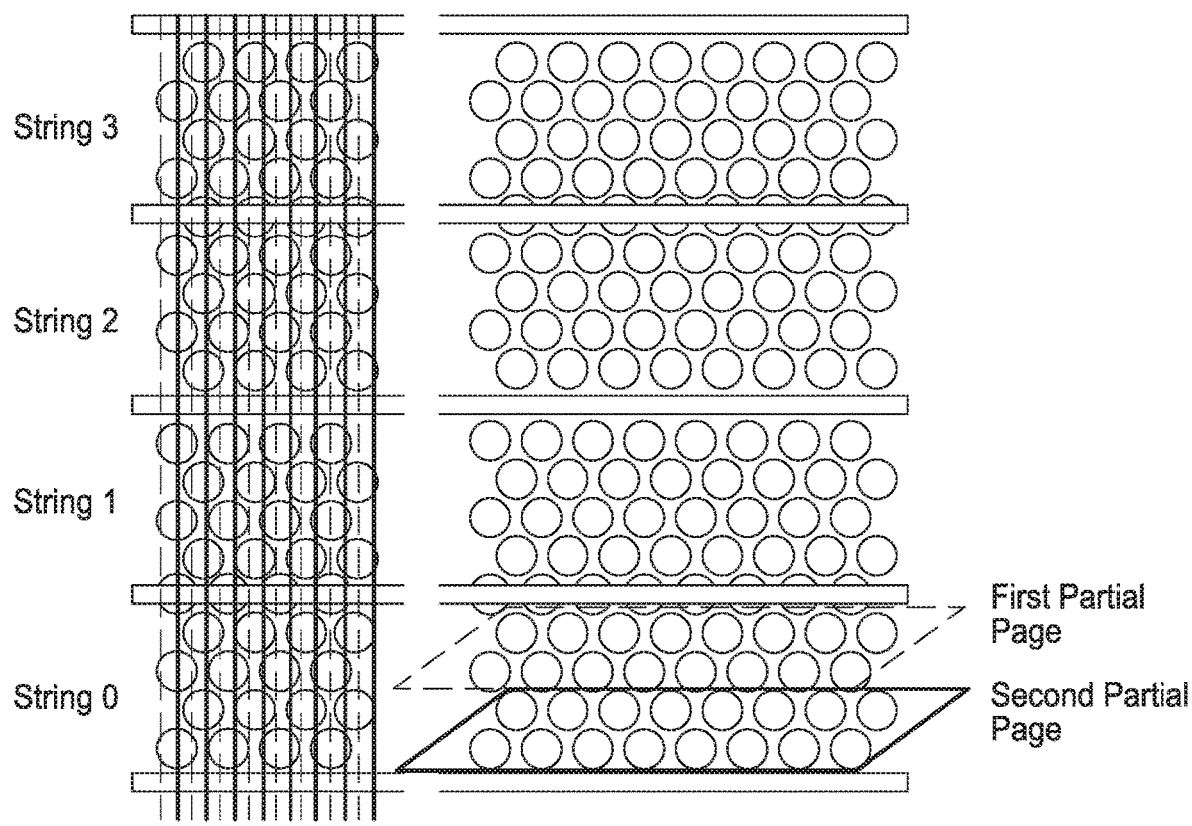
FIG. 3 illustrates a cross-sectional view of a layer of cells in a 3D NAND memory.
Figure 4A:
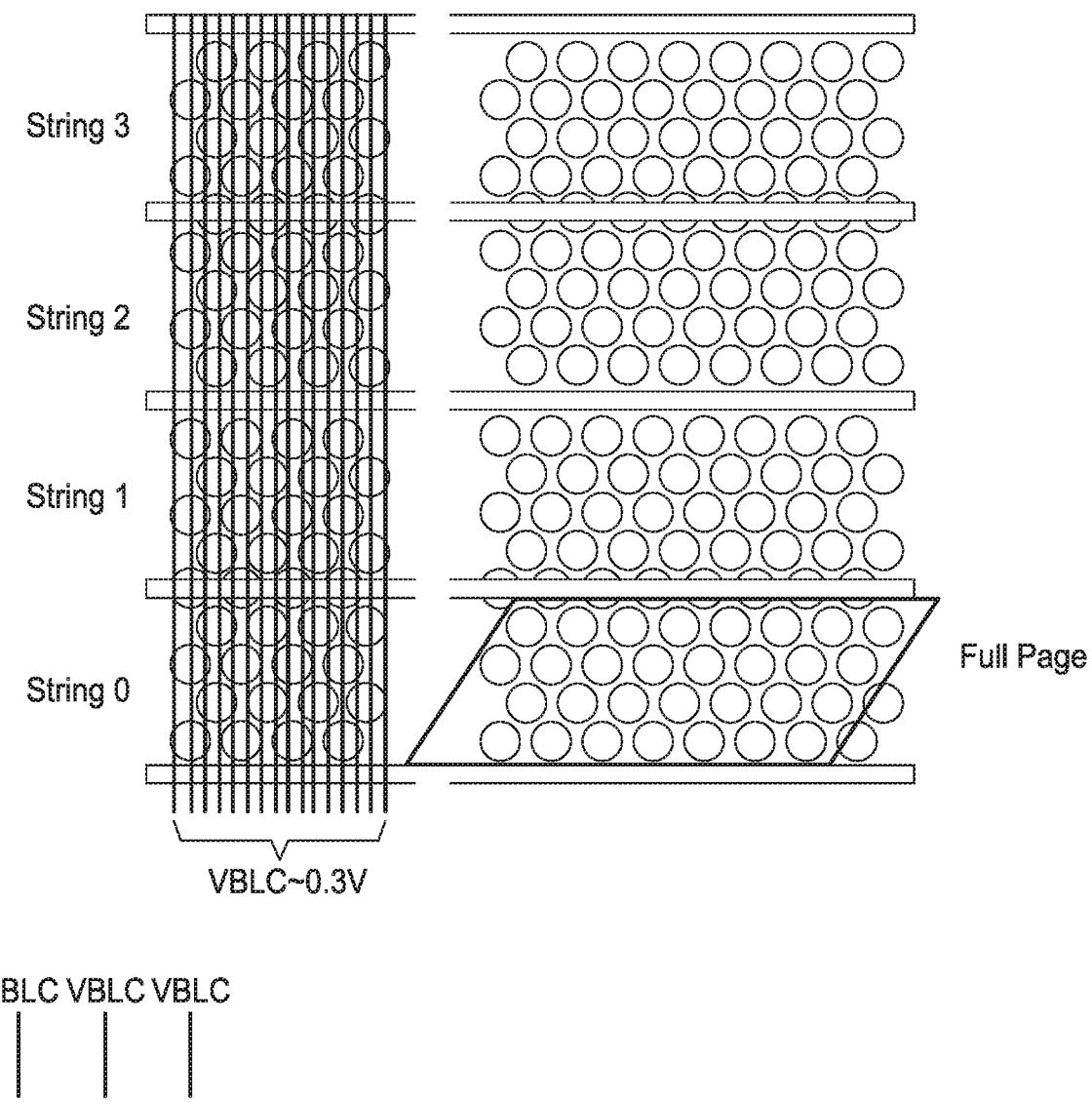
FIGS. 4A, 4B, and 4C illustrate diagrams of full page sensing, ½ partial page sensing (2PPS), and ¼ partial page sensing (4PPS), respectively, and the corresponding bit lines.
Figure 4B:
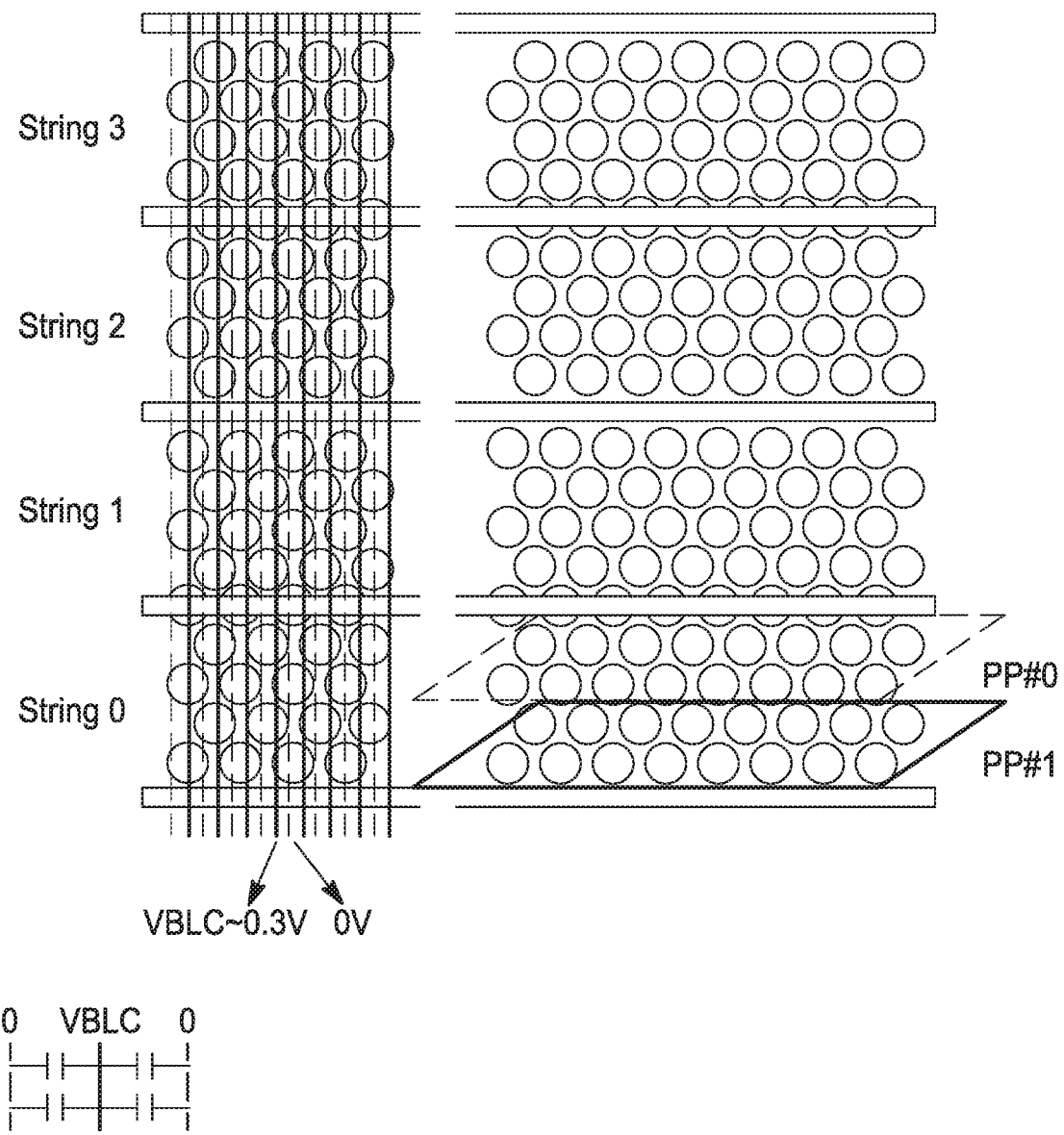
Figure 4C:
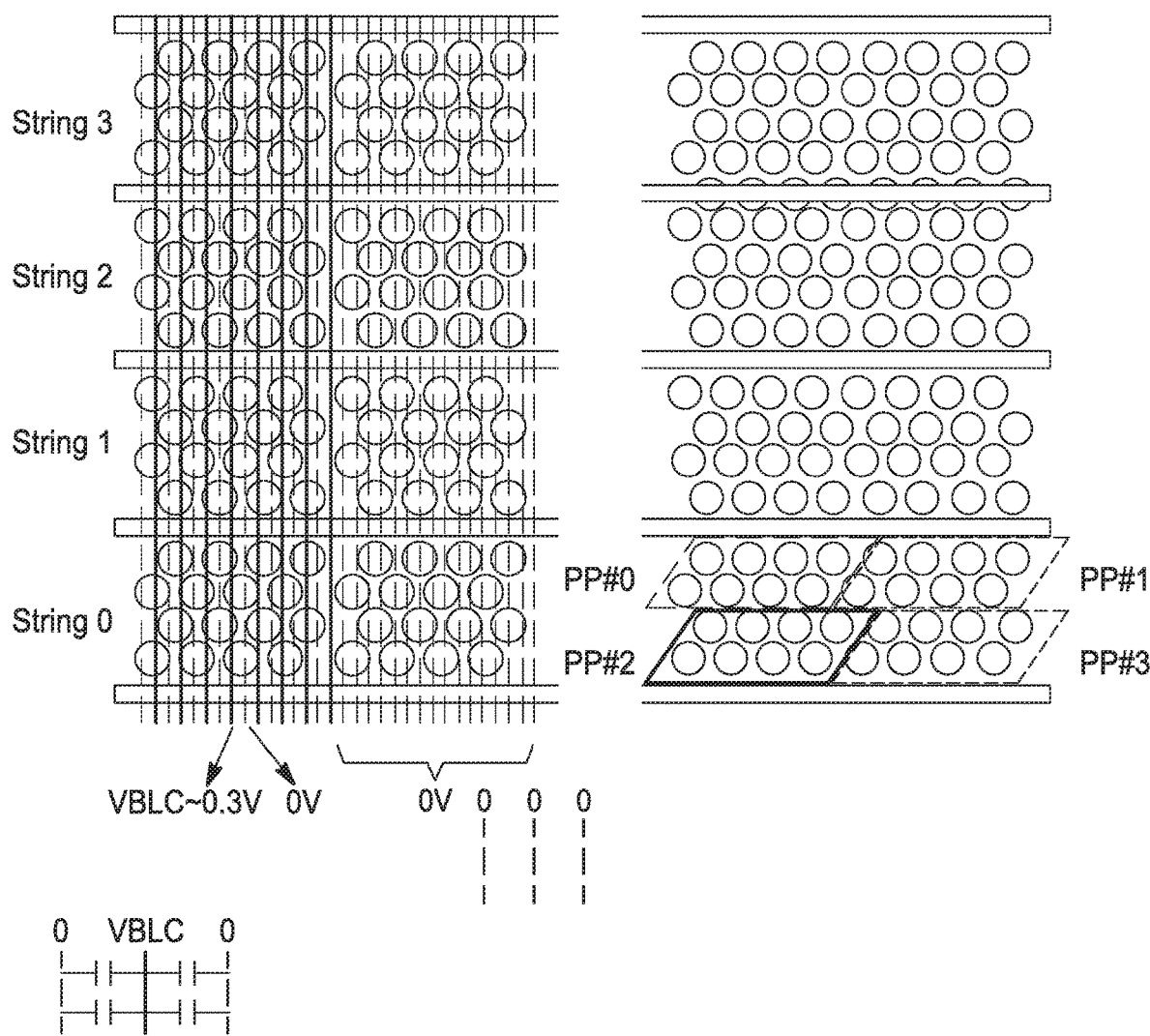
Figure 5A:
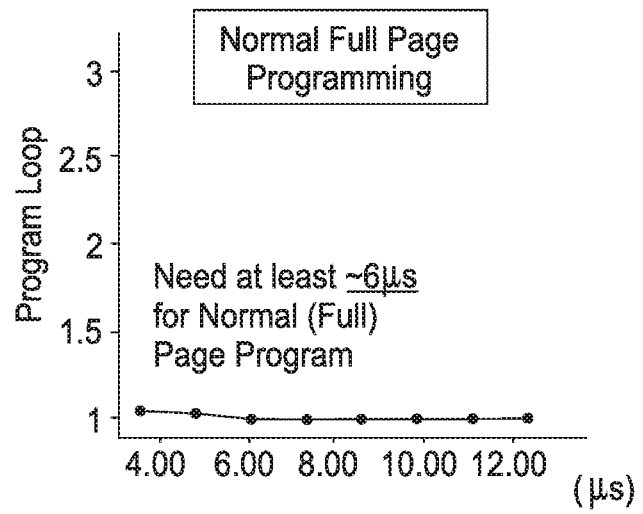
FIGS. 5A and 5B illustrate different sensing times for full page sensing (FIG. 5A) as compared to 2PPS.
Figure 5B:
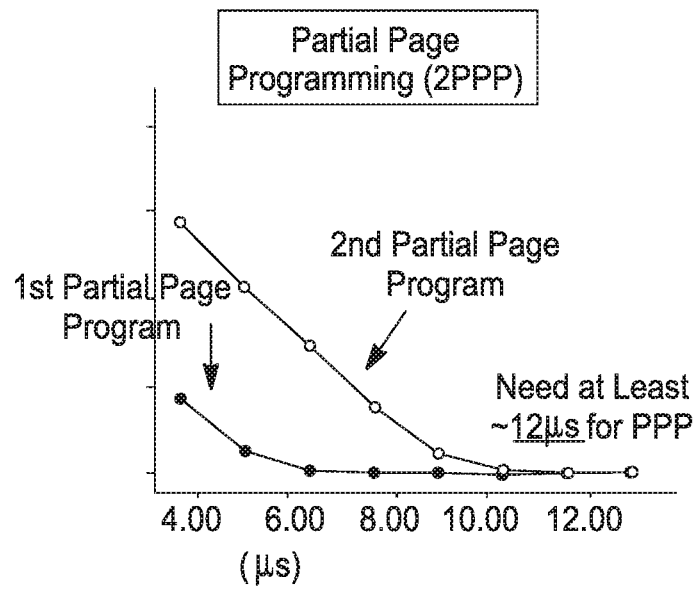

Reference will now be made in detail to exemplary embodiments which are illustrated in the accompanying drawings, wherein like reference numerals refer to like elements throughout. In this regard, the exemplary embodiments may have different forms and may not be construed as being limited to the descriptions set forth herein.

It will be understood that the terms "include," "including", "comprise, and/or "comprising," when used in this specification, specify the presence of stated features, integers, steps, operations, elements, and/or components, but do not preclude the presence or addition of one or more other features, integers, steps, operations, elements, components, and/or groups thereof.

It will be further understood that, although the terms "first," "second," "third," etc., and "primary," secondary," tertiary," etc., may be used herein to describe various operations, elements, components, regions, layers and/or sections, these operations, elements, components, regions, layers and/or sections may not be limited by these terms. These terms are used only to distinguish one element, component, region, layer or section from another element, component, region, layer or section.

As used herein, the term "and/or" includes any and all combinations of one or more of the associated listed items. Expressions such as "at least one of," when preceding a list of elements, modify the entire list of elements and do not modify the individual elements of the list. In addition, the terms such as "unit," "-er," "-or," "module," and "unit" described in the specification refer to an element for performing at least one function or operation, and may be implemented in hardware, software, or the combination of hardware and software.

Various terms are used to refer to particular system components. Different companies may refer to a component by different names—this document does not intend to distinguish between components that differ in name but not in function.

A detailed description of matters of these exemplary embodiments that are obvious to those of ordinary skill in the technical field to which these exemplary embodiments pertain may be omitted herefrom.

As noted above, related art 2PPS and 4PPS have a problem in that the alternate bit line charging results in strong bit line-bit line capacitive coupling and slow ramp-up.

Figure 6A:
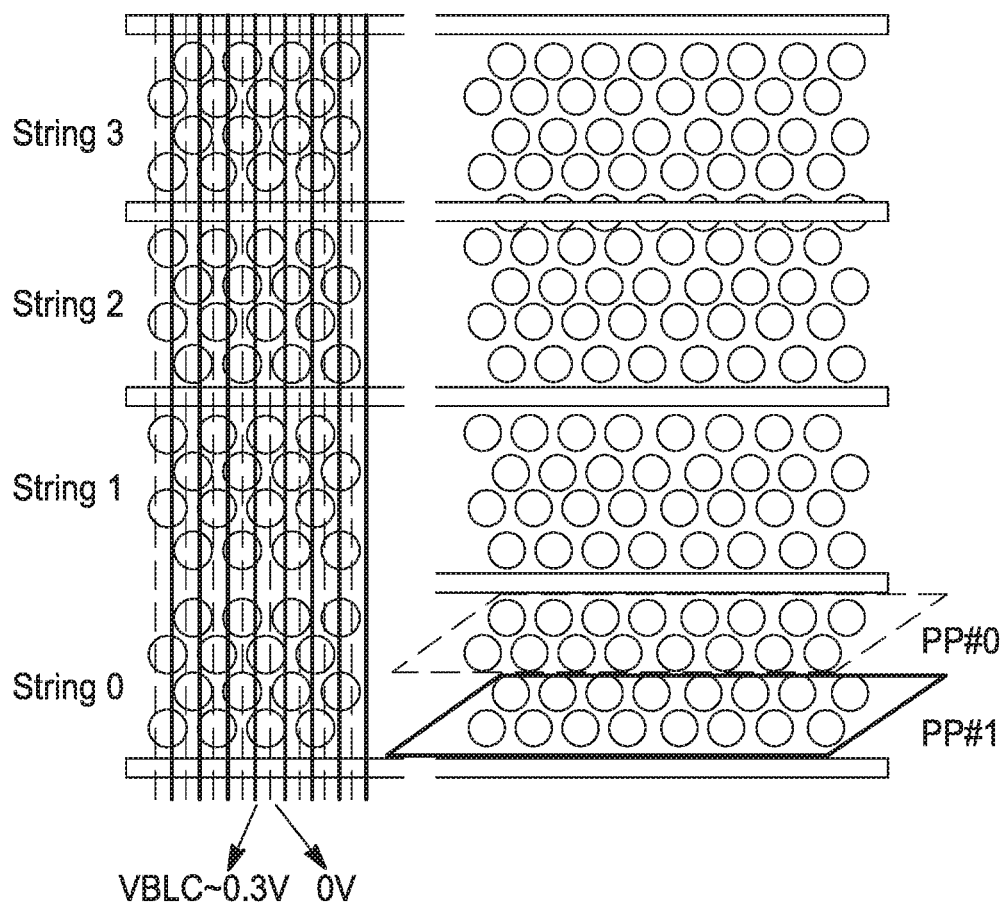
FIGS. 6A and 6B are diagrammatic illustrations of 2PPS according to the related art and to an exemplary embodiment, respectively.
Figure 6A:
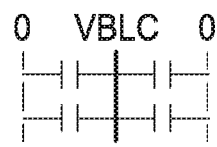
Figure 6B:
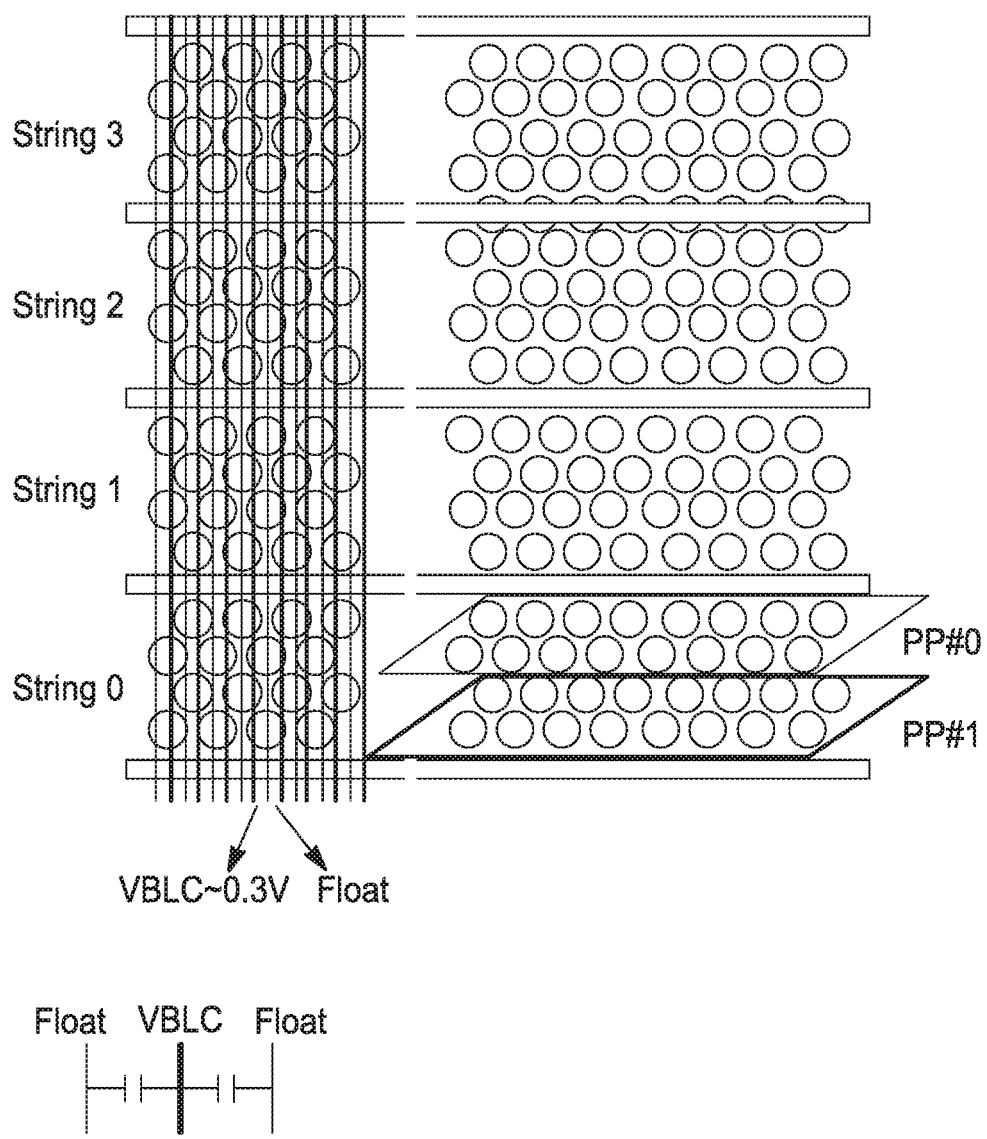

FIGS. 6A and 6B are diagrammatic illustrations of 2PPS according to the related art and to an exemplary embodiment, respectively. As shown in FIG. 6A, the bit lines corresponding to the selected PP #1, shown as solid, bold lines, are driven to VBLC, and the bit lines corresponding to the non-selected PP #0, shown as dashed lines, are grounded. As discussed above, this results in undesired capacitive coupling between adjacent bit lines and long sensing/read times.

According to an exemplary embodiment shown in FIG. 6B, cells in non-selected partial pages are floated rather than grounded. Accordingly, the bit lines corresponding to a selected PP #1, shown as solid, bold lines are driven to VBLC, and the bit lines corresponding to the cells of the non-selected PP #0, which are floated, are shown as thin, solid lines. The floating of the unselected bit lines results in significantly reduced capacitive coupling, as compared to the related art in which the unselected bit lines are grounded, resulting in faster ramp up/down speeds in the selected partial page, and shorter sensing/read times.

Figure 7:
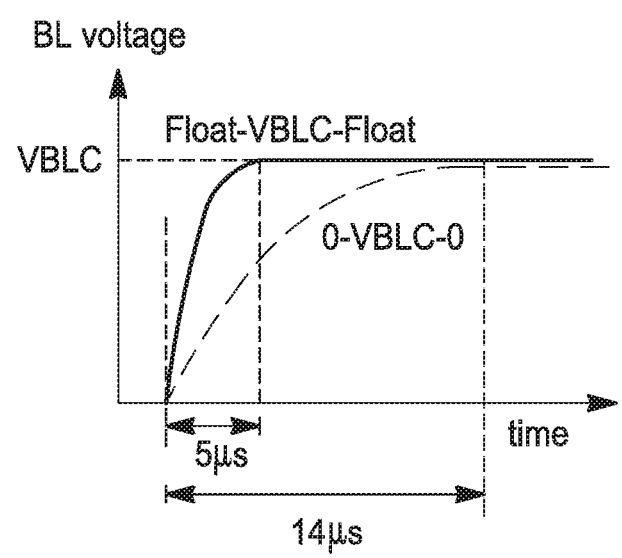
FIG. 7 illustrates exemplary improvements in ramp up speed according to the exemplary embodiment of FIG. 6B as compared with the related art of FIG. 6A.

FIG. 7 illustrates exemplary improvements in ramp up speed according to the exemplary embodiment of FIG. 6B as compared with the related art of FIG. 6A. As shown, the exemplary embodiment of FIG. 6B, in which the bit lines corresponding to the non-selected partial page are floated, may provide a significantly faster ramp-up time, which leads to faster sending/read times.

Figure 8A:
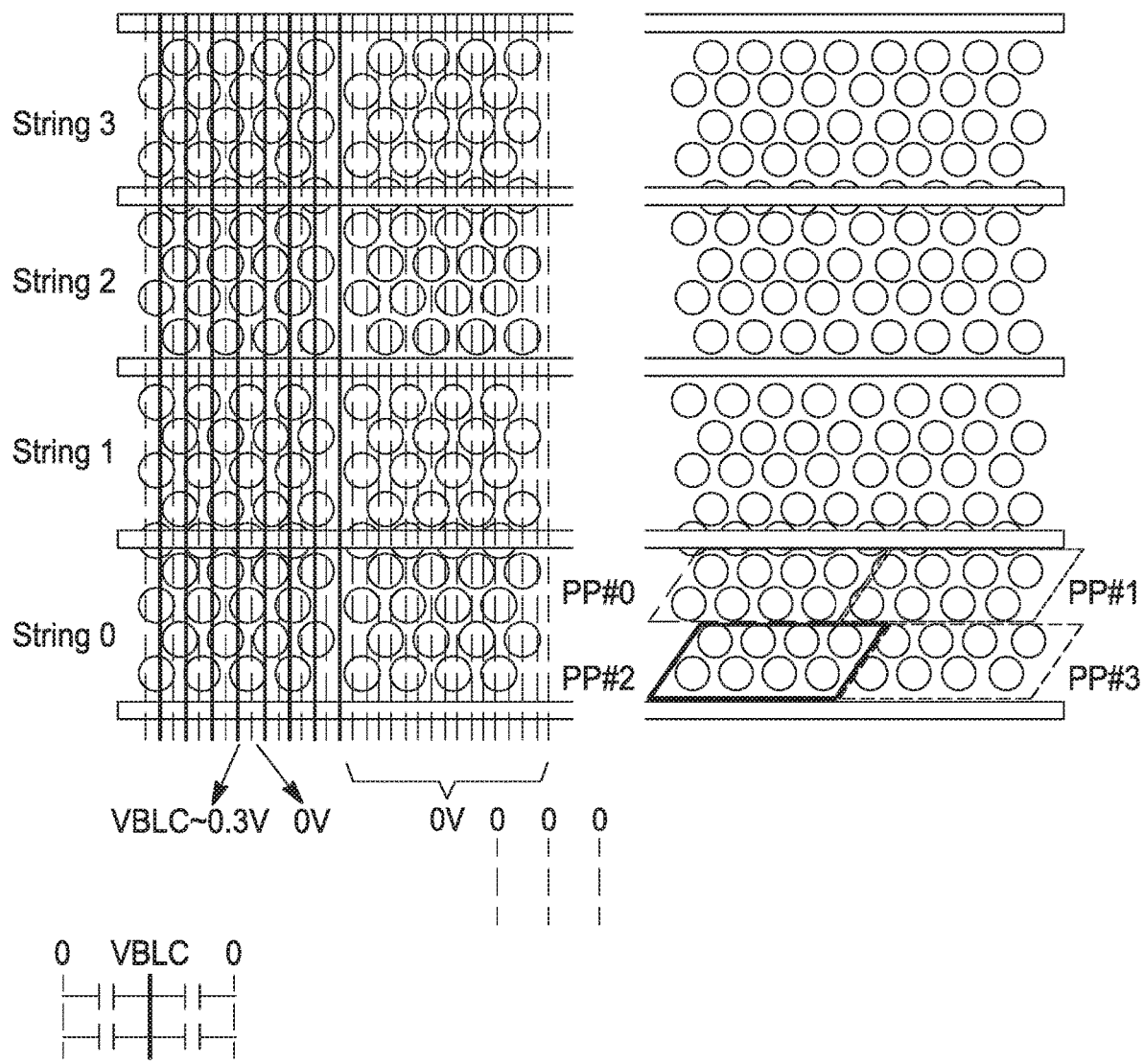
FIGS. 8A, 8B, 8C, and 8D are diagrammatic illustrations of 4PPS according to the related art (FIG. 8A) and to exemplary embodiments (FIGS. 8B, 8C, and 8D)
Figure 8B:
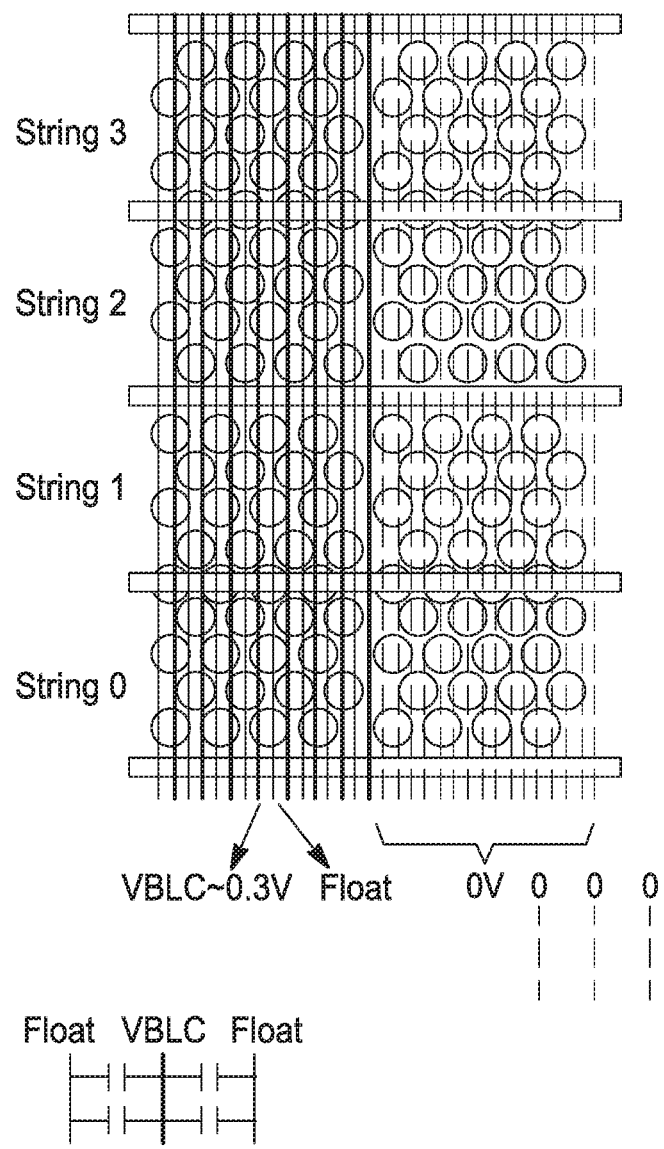
Figure 8C:
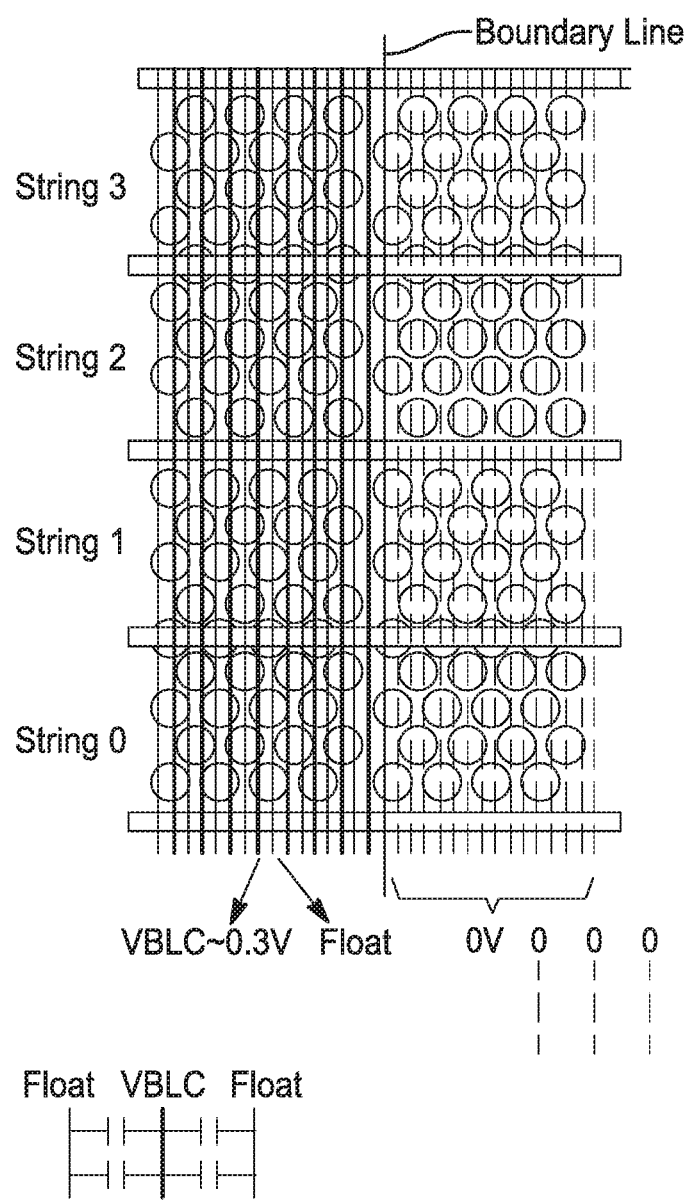
Figure 8D:
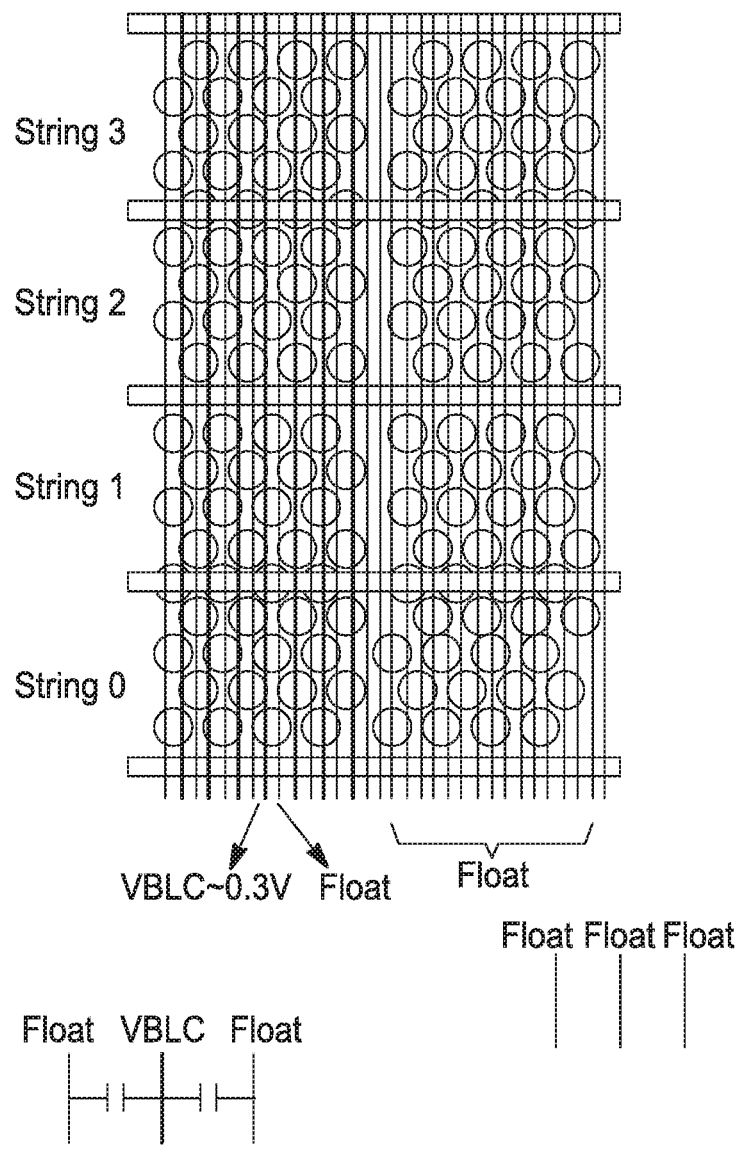

FIGS. 8A, 8B, 8C, and 8D are diagrammatic illustrations of 4PPS according to the related art (FIG. 8A) and to exemplary embodiments (FIGS. 8B, 8C, and 8D). As shown in FIG. 8A, the bit lines corresponding to the selected PP #2, shown as solid, bold lines, are driven to VBLC, and the bit lines corresponding to the non-selected PP #0, PP #1, and PP #3, shown as dashed lines, are grounded. As discussed above, this results in undesired capacitive coupling and long sensing/read times.

According to an exemplary embodiment shown in FIG. 8B, cells in the non-selected partial page corresponding to bit lines interleaved with bit lines of the selected partial page are floated rather than grounded, and the bit lines corresponding to the other non-selected partial pages are grounded. The floating of the unselected, interleaved bit lines results in significantly reduced capacitive coupling, as compared to the related art in which the unselected bit lines are grounded, resulting in faster ramp up/down speeds in the selected partial page, and shorter sensing/read times. As shown in FIG. 8B, the bit lines corresponding to the selected PP #2, shown as solid, bold lines, are driven to VBLC. The bit lines corresponding to non-selected PP #0, which are physically adjacent to the bit lines of the selected PP #2 and are shown as thin, solid lines, are floated. The bit lines corresponding to the non-selected PP #1 and PP #3 are shown as dashed lines and are grounded. This arrangement results in faster ramp up/down speeds in the selected partial page, and shorter sensing/read times, as compared to the related art in which all of the bit lines of the non-selected partial pages are grounded.

It is noted however, that according to the exemplary embodiment of FIG. 8B, one of the bit lines of the selected partial page #2, which is driven to VBLC, is adjacent to a bit line of the non-selected partial page #1, which is grounded. This may result in undesired capacitive coupling and a longer sensing/reading time for the cells associated with this single bit line of the selected partial page #2.

According to an exemplary embodiment shown in FIG. 8C, as in the exemplary embodiment of FIG. 8B, cells in the non-selected partial page corresponding to bit lines interleaved with bit lines of the selected partial page are floated rather than grounded. However, in contrast to the exemplary embodiment of FIG. 8B, one of the bit lines of the non-selected PP #1 is floated, as shown with a thin, solid line. This floating of the single unselected bit line of PP #1 addresses the above-noted issue with respect to the single bit line of the selected PP #3.

According to an exemplary embodiment shown in FIG. 8D, cells in all of the non-selected partial pages PP #0, PP #1, and PP #3 are floated rather than grounded. As discussed with respect to the embodiments of FIGS. 8B and 8C, the floating of the unselected bit lines results in significantly reduced capacitive coupling, as compared to the related art, resulting in faster ramp up/down speeds and shorter sensing/reading times.

Figure 9:
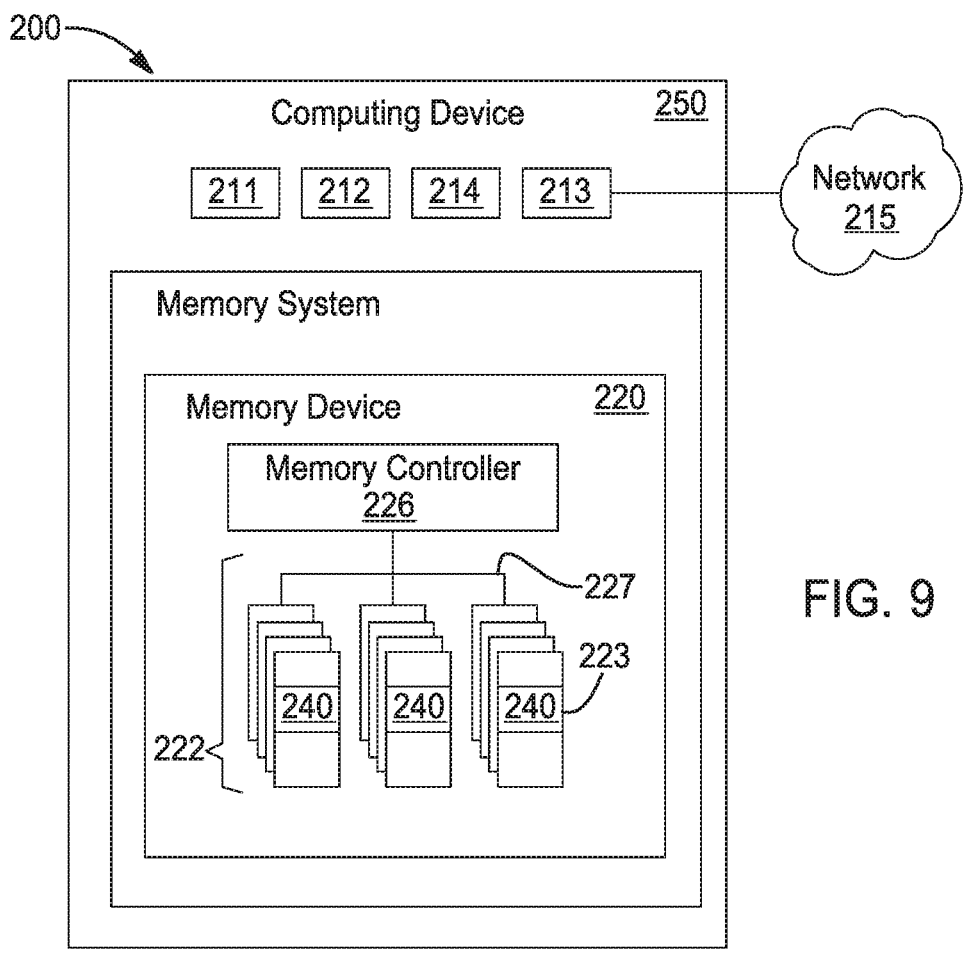
FIG. 9 is a schematic block diagram illustrating a system and device configured to implement PPS according to an exemplary embodiment.

FIG. 9 is a schematic block diagram illustrating a system 200 and device 250 configured to implement PPS according to the exemplary embodiments described hereinabove. The computing device 250 comprises one or more partial page circuits 240 for memory media 222 of a memory device 220.

The memory device 220 may at least partially operate on and/or in communication with the memory system 200 of a computing device 250 which can include a processor 211, a volatile memory 212, and a communication interface 213. The processor 211 can include one or more central processing units (CPU), one or more general-purpose processors, one or more application-specific processors, one or more processor cores, or the like.

The partial page circuit 240 can be disposed at or toward an edge and/or peripheral of a memory element 223, adjacent and/or next to an array of memory media 222, similar to the read/write circuitry discussed above with respect to FIG. 1. Alternately, the partial page circuit 240 may be disposed on a different level, layer, and/or plane of an integrated circuit device than an array of memory media 222 (e.g. CMOS or other circuit under the array, parallel with and offset from the array, or the like). The partial page circuit may automatically perform the exemplary embodiments described herein including, but not limited to for example, automatically applying VBLC, automatically applying a ground voltage to one or more bit lines, automatically floating one or more bit lines, automatically defining two or more partial pages, automatically selecting one of the two or more partial pages for programming and/or reading/scanning, and automatically performing reading and/or scanning by reading bit values of the cells of the memory element and/or sensing the threshold voltage (Vt) of the cells of the memory element.

Figure 10:
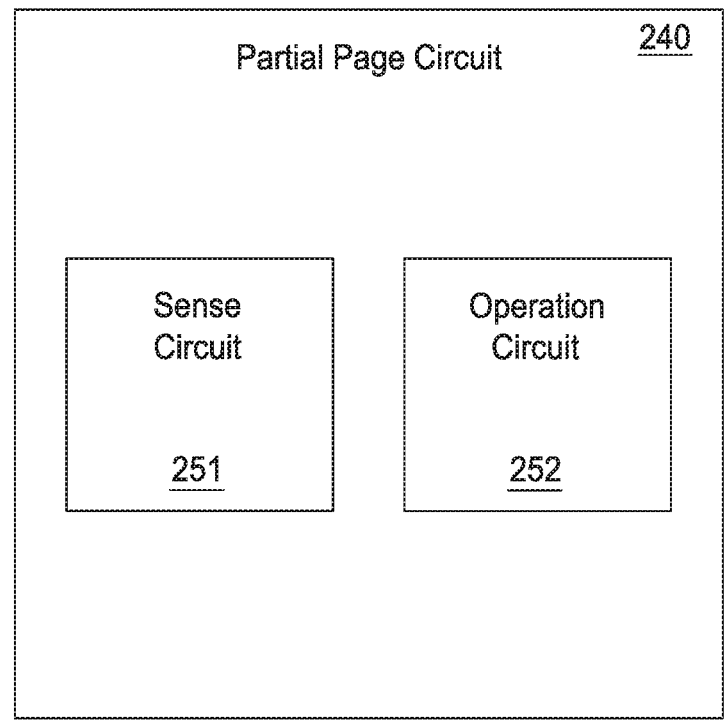
FIG. 10 is a block diagram illustrating a partial page circuit according to an exemplary embodiment.

FIG. 10 is a block diagram illustrating a partial page circuit 240 according to an exemplary embodiment. The partial page circuit 240 may include an operation circuit 252 which may be any circuit configured to automatically apply VBLC, automatically apply a ground voltage to one or more bit lines, and automatically float one or more bit lines. The partial page circuit also may include a sense circuit which may be any circuit configured to automatically perform reading and/or scanning of the selected partial page by reading bit values of the cells and/or sensing the threshold voltage (Vt) of the cells.

The memory device 220 may be disposed in any one or more various locations with respect to the computing device 210, and may include one or more memory elements 223, such as semiconductor chips or packages or other integrated circuit devices disposed on one or more printed circuit boards, storage housings, and/or other mechanical and/or electrical support structures. For example, the memory device 220 can comprise one or more direct inline memory module (DIMM) cards, one or more expansion cards and/or daughter cards, a memory card, a universal serial bus (USB) drive, a solid-state-drive (SSD) or other hard drive device, and/or can have another memory and/or storage form factor. The memory device 220 can be integrated with and/or mounted on a motherboard of the computing device 210, installed in a port and/or slot of the computing device 210, installed on a different computing device 210 and/or a dedicated storage appliance on a network 215, in communication with the computing device 210 over an external bus (e.g., an external hard drive), or the like.

An element 223 of memory media 222 may include volatile memory medium 222, such as random-access memory (RAM), dynamic RAM (DRAM), synchronous DRAM (SDRAM), double data rate (DDR) SDRAM, static RAM (SRAM), thyristor RAM (T-RAM), zero-capacitor RAM (Z-RAM), or the like. Alternately, an element 223 of memory media 222 may include a non-volatile memory medium 222, such as ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS) memory, programmable metallization cell (PMC) memory, conductive-bridging RAM (CBRAM), magneto-resistive RAM (MRAM), magnetic storage media (e.g., hard disk, tape), optical storage media, or the like. Thus, the memory device 220 may rely, for example, on stored voltage levels or stored resistance levels. The one or more elements 223 of memory media 222, in certain embodiments, comprise storage class memory (SCM). The 3D NAND memory described above with respect to FIG. 1 is one example of an element 223 of memory media 222.

The memory device 220 may be disposed on a memory bus of a processor 211 (e.g., on the same memory bus as the volatile memory 212, on a different memory bus from the volatile memory 212, in place of the volatile memory 212, or the like). Alternately, the memory device 220 may be disposed on a peripheral bus of the computing device 210, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. Alternately, the memory device 220 may be disposed on a data network 215, such as an Ethernet network, an Infiniband network, Small Computer System Interface (SCSI) remote direct memory access (RDMA) over a network 215, a storage area network (SAN), a local area network (LAN), a wide area network (WAN) such as the Internet, another wired and/or wireless network 215, or the like.

The computing device 250 can additionally include a non-transitory, computer readable storage medium 214. The computer readable storage medium 214 can have stored thereon executable instructions configured to cause the computing device 210 (e.g., processor 211) to perform operations according to one or more exemplary embodiments described herein.

A partial page circuit 240 can include hardware of a memory element 223, computer executable program code of a device driver, firmware of a memory controller 226 and/or a memory media controller for a memory element 223, another electrical component, or the like. The partial page circuit 240 may be integrated on a memory element 223 (e.g., an on-die partial page circuit 240 and/or other integrated hardware). The non-volatile memory controller 226 can be communicatively coupled to the non-volatile memory media 222 by way of a bus 227.

The memory device 220 may include a memory controller 226 which manages one or more memory devices 220 and/or memory elements 223, one or more of which can comprise an on-die partial page circuit 240. The memory device(s) 220 may include recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a memory device 220). Memory units and/or regions can include, but are not limited to: pages, memory divisions, blocks, sectors, collections or sets of physical storage locations (e.g., logical pages, logical blocks), or the like.

The partial page circuit 240, illustrated in FIG. 10, may be coupled to conductive channels of a memory element 223 by bit lines, source lines, and word lines, as discussed with respect to FIG. 1. In this way, the partial page circuit may apply the VBLC to one or more of the bit lines, and/or may ground or float any one or more of the bit lines. The sense circuit 251 may read bit values from memory cells of the memory element 223 or may sense a threshold voltage of the memory cells of the memory element in a verify operation.

It may be understood that the exemplary embodiments described herein may be considered in a descriptive sense only and not for purposes of limitation. Descriptions of features or aspects within each exemplary embodiment may be considered as available for other similar features or aspects in other exemplary embodiments.

While exemplary embodiments have been described with reference to the figures, it will be understood by those of ordinary skill in the art that various changes in form and details may be made therein without departing from the spirit and scope as defined by the following claims.

What is claimed is:
1. A partial page sensing method comprising:
applying a bit line voltage (VBLC) to first bit lines of a memory cell array, wherein the memory cell array comprises a plurality of strings of memory cells, each string of memory cells partitioned into a plurality of partial pages comprising a first partial page connected to the first bit lines, and a second partial page connected to second bit lines which are interleaved with the first bit lines;
while applying the VBLC to the first bit lines, floating the second bit lines; and one of reading and sensing memory cells within the first partial page.

2. The method according to claim 1, wherein the plurality of partial pages comprises the first partial page connected to the first bit lines, the second partial page connected to the second bit lines which are interleaved with the first bit lines, a third partial page connected to third bit lines, and a fourth partial page connected to fourth bit lines which are interleaved with the third bit lines, and wherein the method further comprises:
while applying the VBLC to the first bit lines and floating the second bit lines, grounding the third bit lines and the fourth bit lines.

3. The method according to claim 1, wherein the plurality of partial pages comprises the first partial page connected to the first bit lines, the second partial page connected to the second bit lines which are interleaved with the first bit lines, a third partial page connected to third bit lines, and a fourth partial page connected to fourth bit lines which are interleaved with the third bit lines, and wherein the method further comprises:
while applying the VBLC to the first bit lines and floating the second bit lines, floating the third bit lines and the fourth bit lines.

4. The method according to claim 1, wherein the plurality of partial pages comprises the first partial page connected to the first bit lines, the second partial page connected to the second bit lines which are interleaved with the first bit lines, a third partial page connected to third bit lines, and a fourth partial page connected to fourth bit lines which are interleaved with the third bit lines, and wherein the method further comprises:
while applying the VBLC to the first bit lines:
grounding the third bit lines,
floating a boundary fourth bit line which is one of the fourth bit lines which is adjacent to one of the first bit lines, and
grounding the fourth bit lines that are not adjacent to any one of the first bit lines.

5. A non-volatile memory storage system comprising:
a memory cell array coupled to a word line, the memory cell array comprising a plurality of strings of memory cells, each string of memory cells partitioned into a plurality of partial pages comprising a first partial page connected to first bit lines, and a second partial page connected to second bit lines which are interleaved with the first bit lines; and
a partial page circuit comprising an operation circuit and a sense circuit;
wherein the operation circuit is configured to apply a bit line voltage (VBLC) to the first bit lines and, while applying the VBLC to the first bit lines, floating the second bit lines, and
wherein the sense circuit is configured to perform one of reading and sensing memory cells within the first partial page.

6. The system according to claim 5, wherein the plurality of partial pages comprises the first partial page connected to the first bit lines, the second partial page connected to the second bit lines which are interleaved with the first bit lines, a third partial page connected to third bit lines, and a fourth partial page connected to fourth bit lines which are interleaved with the third bit lines; and
wherein the operation circuit is further configured to ground the third bit lines and the fourth bit lines, while applying the VBLC voltage to the first bit lines.

7. The system according to claim 5, wherein the plurality of partial pages comprises the first partial page connected to the first bit lines, the second partial page connected to the second bit lines which are interleaved with the first bit lines, a third partial page connected to third bit lines, and a fourth partial page connected to fourth bit lines which are interleaved with the third bit lines; and
wherein the operation circuit is further configured to float the third bit lines and the fourth bit lines, while applying the VBLC to the first bit lines.

8. The system according to claim 5, wherein the plurality of partial pages comprises the first partial page connected to the first bit lines, the second partial page connected to the second bit lines which are interleaved with the first bit lines, a third partial page connected to third bit lines, and a fourth partial page connected to fourth bit lines which are interleaved with the third bit lines; and
wherein the operation circuit is further configured to ground the third bit lines, to float a boundary fourth bit line which is one of the fourth bit lines adjacent to one of the first bit lines, and to ground the fourth bit lines that are not adjacent to any one of the first bit lines, while applying the VBLC to the first bit lines.

9. A non-volatile computer-readable medium having recorded thereon a program which, when executed by a processor, causes the processor to execute a method comprising:
applying a bit line voltage (VBLC) to first bit lines of a memory cell array, wherein the memory cell array comprises a plurality of strings of memory cells, each string of memory cells partitioned into a plurality of partial pages comprising a first partial page connected to the first bit lines, and a second partial page connected to second bit lines which are interleaved with the first bit lines;
while applying the VBLC to the first bit lines, floating the second bit lines; and
determining a voltage of each of the memory cells of the first partial page.

10. The non-volatile computer-readable medium according to claim 9, wherein the plurality of partial pages comprises the first partial page connected to the first bit lines, the second partial page connected to the second bit lines which are interleaved with the first bit lines, a third partial page connected to third bit lines, and a fourth partial page connected to fourth bit lines which are interleaved with the third bit lines, and wherein the method further comprises:
while applying the VBLC to the first bit lines and floating the second bit lines, grounding the third bit lines and the fourth bit lines.

11. The non-volatile computer-readable medium according to claim 9, wherein the plurality of partial pages comprises the first partial page connected to the first bit lines, the second partial page connected to the second bit lines which are interleaved with the first bit lines, a third partial page connected to third bit lines, and a fourth partial page connected to fourth bit lines which are interleaved with the third bit lines, and wherein the method further comprises:
while applying the VBLC to the first bit lines and floating the second bit lines, floating the third bit lines and the fourth bit lines.

12. The non-volatile computer-readable medium according to claim 9, wherein the plurality of partial pages comprises the first partial page connected to the first bit lines, the second partial page connected to the second bit lines which are interleaved with the first bit lines, a third partial page connected to third bit lines, and a fourth partial page connected to fourth bit lines which are interleaved with the third bit lines, and wherein the method further comprises:
  while applying the VBLC to the first bit lines:
  grounding the third bit lines,
  floating a boundary fourth bit line which is one of the fourth bit lines which is adjacent to one of the first bit lines, and
  grounding the fourth bit lines that are not adjacent to any one of the first bit lines.

* * * * *